United States Patent
Nakayama et al.

(10) Patent No.: US 10,322,934 B2
(45) Date of Patent: Jun. 18, 2019

(54) SILICON NITRIDE SUBSTRATE AND SILICON NITRIDE CIRCUIT BOARD USING THE SAME

(71) Applicants: KABUSHIKI KAISHA TOSHIBA, Tokyo (JP); TOSHIBA MATERIALS CO., LTD., Yokohama-Shi (JP)

(72) Inventors: Noritaka Nakayama, Yokohama (JP); Katsuyuki Aoki, Yokohama (JP); Takashi Sano, Fujisawa (JP)

(73) Assignees: Kabushiki Kaisha Toshiba, Minato-Ku (JP); Toshiba Materials Co., Ltd., Yokohama-Shi (JP)

( * ) Notice: Subject to any disclaimer, the term of this patent is extended or adjusted under 35 U.S.C. 154(b) by 0 days.

(21) Appl. No.: 15/833,113

(22) Filed: Dec. 6, 2017

(65) Prior Publication Data

US 2018/0134558 A1    May 17, 2018

Related U.S. Application Data

(63) Continuation of application No. 15/430,920, filed on Feb. 13, 2017, now Pat. No. 9,884,762, which is a
(Continued)

(30) Foreign Application Priority Data

Oct. 23, 2013   (JP) .................................. 2013-220459

(51) Int. Cl.
   *C04B 35/584*   (2006.01)
   *C01B 21/068*   (2006.01)
   (Continued)

(52) U.S. Cl.
   CPC ............ *C01B 21/068* (2013.01); *B32B 18/00* (2013.01); *C04B 35/584* (2013.01);
   (Continued)

(58) Field of Classification Search
   CPC ... C04B 35/584; C04B 35/587; C04B 35/589; C04B 35/591; C04B 35/593; C04B 35/5935; H05K 1/03; H05K 1/0306
   See application file for complete search history.

(56) References Cited

U.S. PATENT DOCUMENTS 5,326,733 A   7/1994  Mizuno et al.
5,744,410 A   4/1998  Komatsu et al.
(Continued)

FOREIGN PATENT DOCUMENTS

EP   0 766 307 A1   4/1997
EP   0 963 965 A1   12/1999
(Continued)

OTHER PUBLICATIONS

International Search Report and Written Opinion (Application No. PCT/JP2014/077889) dated Jan. 27, 2015.
(Continued)

*Primary Examiner* — Noah S Wiese
(74) *Attorney, Agent, or Firm* — Burr & Brown, PLLC

(57) ABSTRACT

A silicon nitride substrate including silicon nitride crystal grains and a grain boundary phase and having a thermal conductivity of 50 W/m·K or more, wherein, in a sectional structure of the silicon nitride substrate, a ratio (T2/T1) of a total length T2 of the grain boundary phase in a thickness direction with respect to a thickness T1 of the silicon nitride substrate is 0.01 to 0.30, and a variation from a dielectric strength mean value when measured by a four-terminal method in which electrodes are brought into contact with a front and a rear surfaces of the substrate is 20% or less. The dielectric strength mean value of the silicon nitride substrate can be 15 kV/mm or more. According to above structure, there can be obtained a silicon nitride substrate and a silicon
(Continued)

nitride circuit board using the substrate in which variation in the dielectric strength is decreased.

16 Claims, 3 Drawing Sheets

Related U.S. Application Data continuation of application No. 15/027,829, filed as application No. PCT/JP2014/077889 on Oct. 21, 2014, now Pat. No. 9,630,846.

(51) Int. Cl.

| | | |
|---|---|---|
| H01L 23/15 | (2006.01) | |
| H01L 23/373 | (2006.01) | |
| H05K 1/03 | (2006.01) | |
| H01L 23/498 | (2006.01) | |
| H05K 1/02 | (2006.01) | |
| C04B 35/587 | (2006.01) | |
| C04B 35/593 | (2006.01) | |
| B32B 18/00 | (2006.01) | |
| C04B 35/626 | (2006.01) | |
| C04B 35/632 | (2006.01) | |
| C04B 35/634 | (2006.01) | |
| C04B 35/638 | (2006.01) | |
| C04B 35/63 | (2006.01) | |
| C04B 35/64 | (2006.01) | |

(52) U.S. Cl.
CPC .......... *C04B 35/587* (2013.01); *C04B 35/593* (2013.01); *C04B 35/6263* (2013.01); *C04B 35/6264* (2013.01); *C04B 35/63* (2013.01); *C04B 35/632* (2013.01); *C04B 35/638* (2013.01); *C04B 35/6342* (2013.01); *C04B 35/63424* (2013.01); *C04B 35/64* (2013.01); *H01L 23/15* (2013.01); *H01L 23/3731* (2013.01); *H01L 23/3735* (2013.01); *H01L 23/49838* (2013.01); *H01L 23/49894* (2013.01); *H05K 1/0201* (2013.01); *H05K 1/0306* (2013.01); *C01P 2006/32* (2013.01); *C04B 2235/3206* (2013.01); *C04B 2235/3224* (2013.01); *C04B 2235/3225* (2013.01); *C04B 2235/3232* (2013.01); *C04B 2235/3244* (2013.01); *C04B 2235/383* (2013.01); *C04B 2235/3873* (2013.01); *C04B 2235/5436* (2013.01); *C04B 2235/5445* (2013.01); *C04B 2235/604* (2013.01); *C04B 2235/6025* (2013.01); *C04B 2235/656* (2013.01); *C04B 2235/6565* (2013.01); *C04B 2235/6567* (2013.01); *C04B 2235/6584* (2013.01); *C04B 2235/661* (2013.01); *C04B 2235/723* (2013.01); *C04B 2235/77* (2013.01); *C04B 2235/786* (2013.01); *C04B 2235/85* (2013.01); *C04B 2235/95* (2013.01); *C04B 2235/96* (2013.01); *C04B 2235/9607* (2013.01); *C04B 2237/368* (2013.01); *H01L 23/49877* (2013.01); *H01L 2924/0002* (2013.01)

(56) References Cited

U.S. PATENT DOCUMENTS

| | | | | |
|---|---|---|---|---|
| 6,143,677 | A | * 11/2000 | Miyanaga | ............ C04B 35/591 |
| | | | | 264/647 |
| 2002/0084103 | A1 | 7/2002 | Komatsu et al. | |
| 2011/0176277 | A1* | 7/2011 | Kaga | ..................... C04B 35/584 |
| | | | | 361/707 |
| 2011/0272187 | A1 | 11/2011 | Kaga et al. | |
| 2012/0119349 | A1 | 5/2012 | Naba | |

FOREIGN PATENT DOCUMENTS

| | | |
|---|---|---|
| EP | 1 201 623 A2 | 5/2002 |
| EP | 2 301 906 A1 | 3/2011 |
| JP | 09-069594 A1 | 3/1997 |
| JP | 2001-335359 A1 | 12/2001 |
| JP | 2002-201075 A1 | 7/2002 |
| JP | 2008-239420 A1 | 10/2008 |
| JP | 2013-203633 A1 | 10/2013 |
| WO | 2010/002001 A1 | 1/2010 |
| WO | 2011/010597 A1 | 1/2011 |

OTHER PUBLICATIONS

International Preliminary Report on Patentability (Application No. PCT/JP2014/077889) dated May 6, 2016 (in English).
Extended European Search Report (Application No. 14856390.1) dated Apr. 6, 2017.

\* cited by examiner

SILICON NITRIDE SUBSTRATE AND SILICON NITRIDE CIRCUIT BOARD USING THE SAME

CROSS REFERENCE TO RELATED APPLICATION

This application is a continuation of U.S. application Ser. No. 15/430,920, filed Feb. 13, 2017, which is a continuation of U.S. application Ser. No. 15/027,829, filed Apr. 7, 2016, now U.S. Pat. No. 9,630,846, issued Apr. 25, 2017, which in turn is the National Stage entry of International Application No. PCT/JP2014/077889, filed Oct. 21, 2014, the entireties of which are incorporated herein by reference.

FIELD OF THE INVENTION

Embodiments described hereinbelow generally relate to a silicon nitride substrate and a silicon nitride circuit board using the same.

BACKGROUND OF THE INVENTION

In recent years, the application of silicon nitride ($Si_3N_4$) substrates to semiconductor circuit boards is being attempted. Alumina ($Al_2O_3$) substrates and aluminum nitride (AlN) substrates are used as semiconductor circuit boards. Although an alumina substrate has a thermal conductivity of around 30 W/m·K, the use thereof enables a reduction in costs. Further, in the case of an aluminum nitride substrate, it is possible to achieve high thermal conductivity in which the thermal conductivity becomes 160 W/m·K or more. On the other hand, substrates having a thermal conductivity of 50 W/m·K or more are being developed as silicon nitride substrates.

Although a silicon nitride substrate has a low thermal conductivity compared to an aluminum nitride substrate, the silicon nitride substrate has a superior three-point bending strength of 500 MPa or higher. The three-point bending strength of an aluminum nitride substrate is normally between around 300 and 400 MPa, and there is a tendency for the strength to decrease as the thermal conductivity increases. It is possible to make use of this advantage of high strength to reduce the thickness of a silicon nitride substrate. Since it is possible to lower the thermal resistance by thinning the substrate, heat dissipation (heat radiating property) is improved.

A silicon nitride substrate that makes uses of such characteristics has been widely used as a circuit board by providing a circuit portion such as a metallic plate thereon. Further, a method is also available in which a silicon nitride substrate is used as a circuit board for a pressure-contact structure, as described in International Publication No. WO 2011/010597 (Patent Document 1).

Thermal conductivity, strength and also insulating properties can be mentioned as examples of characteristics required of a silicon nitride substrate for the various usages described above.

A silicon nitride substrate with favorable insulating properties is proposed in Japanese Patent Laid-Open No. 2002-201075 (Patent Document 2). In Patent Document 2, a silicon nitride substrate is disclosed in which a current leakage value is 1000 nA or less when an alternating voltage of 1.5 kV and 100 Hz is applied between a front surface and a rear surface of the silicon nitride substrate under conditions of a temperature of 25° C. and a humidity of 70%. A lower value for the current leakage value indicates higher insulating properties between the front and rear surfaces.

PRIOR ART DOCUMENTS

Patent Documents

Patent Document 1: International Publication No. WO 2011/010597 pamphlet
Patent Document 2: Japanese Patent Laid-Open No. 2002-201075

SUMMARY OF THE INVENTION

Problems to be Solved by the Invention

However, there have been cases in which the insulating properties are insufficient even if the current leakage value is equal to or less than a fixed value as described in Patent Document 2. As the result of thoroughly investigating the cause of the problem, it was found that an abundance ratio of silicon nitride crystal grains to a grain boundary phase in the thickness direction of the substrate is significantly related to the aforementioned situation. A silicon nitride substrate is made from a silicon nitride sintered body that comprises silicon nitride crystal grains and a grain boundary phase. In comparison to the grain boundary phase, the silicon nitride crystal grains have superior insulating properties. Therefore, a portion in which the insulating properties differ according to the abundance ratio of the grain boundary phase is formed within the silicon nitride substrate. Consequently, even if the current leakage value is equal to or less than a fixed value, a phenomenon occurs such that the insulating properties become insufficient.

Means for Solving the Problems

A silicon nitride substrate according to an embodiment is a silicon nitride substrate comprising silicon nitride crystal grains and a grain boundary phase and having a thermal conductivity of 50 W/m·K or more, in which, in a sectional structure of the silicon nitride substrate, a ratio (T2/T1) between a total length T2 of the grain boundary phase and a thickness T1 of the silicon nitride substrate is between 0.01 and 0.30, and a variation from a dielectric strength mean value as measured by a four-terminal method in which electrodes are brought into contact with the front and rear surfaces of the substrate is 20% or less.

Advantage of the Invention

In the silicon nitride substrate according to an embodiment, the ratio (T2/T1) of the total length T2 of the grain boundary phase with respect to the thickness T1 of the silicon nitride substrate is defined within a predetermined range, and hence variations in the insulating properties in the thickness direction are small. Therefore, in the case of using the silicon nitride substrate in a circuit board or the like, a highly reliable circuit board with excellent insulating properties can be obtained.

DETAILED DESCRIPTION OF THE INVENTION

A silicon nitride substrate according to the present embodiment is a silicon nitride substrate comprising silicon nitride crystal grains and a grain boundary phase and having a thermal conductivity of 50 W/m·K or more, in which, in a sectional structure of the silicon nitride substrate, a ratio (T2/T1) between a total length T2 of the grain boundary phase and a thickness T1 of the silicon nitride substrate is from 0.01 to 0.30, and a variation from a dielectric strength mean value as measured by a four-terminal method in which electrodes are brought into contact with the front and rear surfaces of the substrate is 20% or less.

The silicon nitride substrate is made from a silicon nitride sintered body that comprises silicon nitride crystal grains and a grain boundary phase and has a thermal conductivity of 50 W/m·K or more. Preferably the thermal conductivity is 50 W/m·K or more, and more preferably is 90 W/m·K or more. If the thermal conductivity is a low value of less than 50 W/m·K, heat dissipation decreases.

Figure 1:
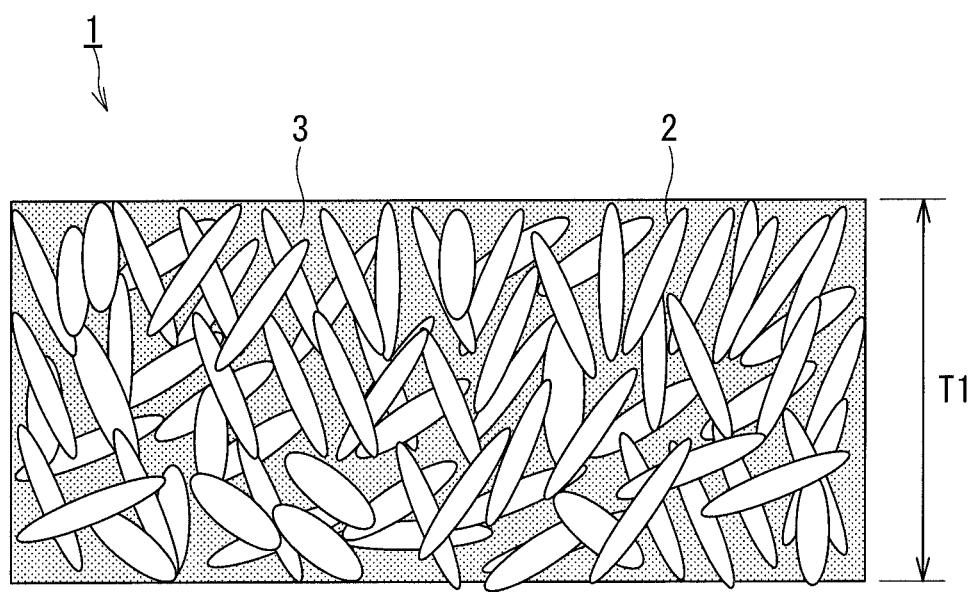
FIG. 1 is a cross-sectional view illustrating an example of the sectional structure of a silicon nitride substrate according to an embodiment.

FIG. 1 illustrates an example of the sectional structure of the silicon nitride substrate according to the embodiment. In FIG. 1, reference numeral 1 denotes a silicon nitride substrate, reference numeral 2 denotes silicon nitride crystal grains, reference numeral 3 denotes a grain boundary phase, and reference character T1 denotes a thickness of the silicon nitride substrate.

Figure 2:
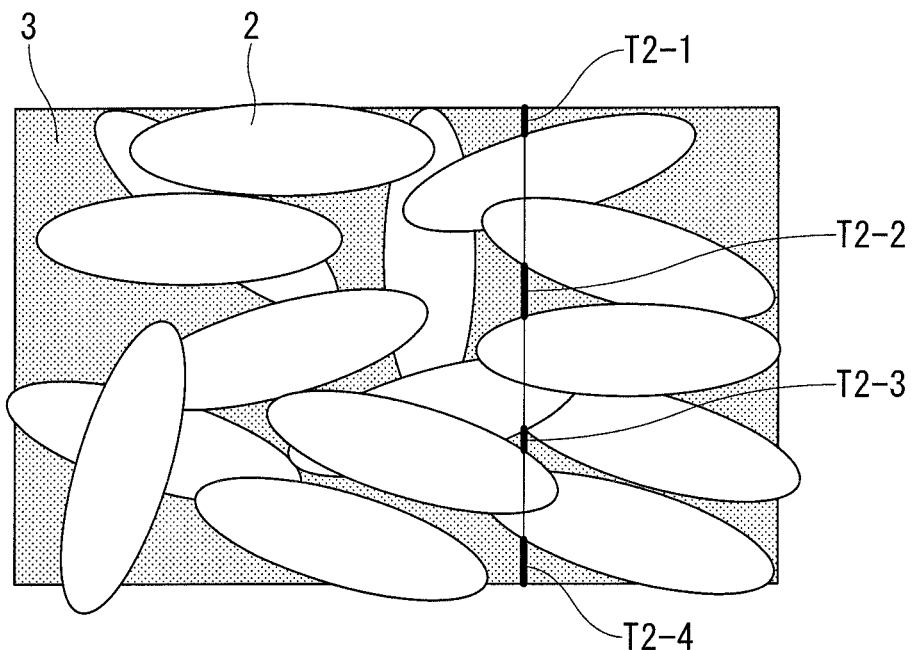
FIG. 2 is a cross-sectional view for describing a ratio (T2/T1) of a total length T2 of a grain boundary phase with respect to a substrate thickness T1 in the silicon nitride substrate according to the embodiment.

Further, FIG. 2 is a cross-sectional view for explaining a ratio (T2/T1) of the total length T2 of the grain boundary phase with respect to the substrate thickness T1 in the silicon nitride substrate according to the embodiment. In FIG. 2, reference numeral 2 denotes the silicon nitride crystal grains, reference numeral 3 denotes the grain boundary phase, and reference characters T2-1 to T2-4 denote respective lengths of the grain boundary phase in the thickness direction.

The silicon nitride substrate is made from a silicon nitride sintered body that comprises silicon nitride crystal grains and a grain boundary phase. Preferably, among the silicon nitride crystal grains, a number proportion of β-$Si_3N_4$ crystal grains is 95% or more and 100% or less. When the number proportion of the β-$Si_3N_4$ crystal grains is equal to or greater than 95%, a structure is obtained in which silicon nitride crystal grains are randomly present, and the strength is thus improved.

The grain boundary phase is mainly constituted by a sintering aid. One or more kinds selected from rare earth elements, magnesium, titanium and hafnium are preferable as a sintering aid. Preferably, the respective sintering aids are contained in a total of 2 to 14 mass % in terms of oxide content. If the amount of a sintering aid is less than 2 mass % in terms of oxide content, there is a risk that a portion will arise at which the abundance ratio of the grain boundary phase is small. Further, if the amount of a sintering aid is an excessive amount that exceeds 14 mass % in terms of oxide content, there is a risk that the abundance ratio of the grain boundary phase will be too large. Therefore, it is preferable that sintering aids are contained within a range of 4.0 to 12.0 mass % in terms of oxide content.

A feature of the sectional structure of the silicon nitride substrate of the embodiment is that a ratio (T2/T1) of the total length T2 of the grain boundary phase with respect to the thickness T1 of the silicon nitride substrate is from 0.01 to 0.30. The thickness T1 of the silicon nitride substrate is the thickness of the substrate as shown in FIG. 1. The thickness T1 of the substrate is measured by calipers.

The method for measuring the total length T2 of the grain boundary phase will now be described with reference to FIG. 2. FIG. 2 is a cross-sectional view for explaining the ratio (T2/T1) of the total length T2 of the grain boundary phase with respect to the substrate thickness T1 in the silicon nitride substrate. In FIG. 2, reference numeral 2 denotes the silicon nitride crystal grains, and reference numeral 3 denotes the grain boundary phase. First, an enlarged photograph is taken of an arbitrary sectional structure in the thickness direction of the silicon nitride substrate. If the sectional structure in the thickness direction cannot be observed in one field of view, an operation to photograph the sectional structure can be divided into a plurality of photographing operations.

Preferably, the enlarged photograph is a scanning-type electron microscope (SEM) photograph. In the case of an SEM photograph, there is the advantage that it is easy to distinguish silicon nitride crystal grains and the grain boundary phase because a contrast difference arises therebetween.

With regard to the magnification, distinction of silicon nitride crystal grains and a grain boundary phase is performed with ease if the magnification is 2,000 times or more. To determine the total length T2 of the grain boundary phase, a straight line is drawn in the substrate thickness direction on the enlarged photograph of the sectional structure, and the length of a grain boundary phase that is present on the straight line is determined.

In the case illustrated in FIG. 2, the total of T2-1, T2-2, T2-3 and T2-4 is the value of T2 (T2= (T2-1)+(T2-2)+(T2-3)+(T2-4)). In the case of photographing an enlarged photograph by performing a plurality of photographing operations, the operation is repeated until the substrate thickness T1 is photographed. Note that, when taking an enlarged photograph, photographing is performed after subjecting an arbitrary cross section to mirror polishing to achieve a surface roughness Ra of 0.05 μm or less, and then performing an etching process. Either of chemical etching and plasma etching is effective as the etching process. Further, pores present in the substrate are not counted as part of the length of the grain boundary phase.

A feature of the sectional structure of the silicon nitride substrate of the embodiment is characterized in that a ratio (T2/T1) of the total length T2 of the grain boundary phase with respect to the thickness T1 of the silicon nitride substrate is ranging from 0.01 to 0.30. If the ratio (T2/T1) is less than 0.01, the insulating properties will decrease because regions in which the grain boundary phase is small will be partially formed. On the other hand, if the ratio (T2/T1) exceeds 0.30, it will cause variations to arise in the insulating properties because regions in which the grain boundary phase is large will be partially formed. In order to ensure both the insulating properties and the reduction of such variations, preferably the aforementioned ratio (T2/T1) is within a range of 0.10 to 0.25.

By defining the aforementioned ratio (T2/T1) within a range of 0.10 to 0.30 in this manner, a variation from a dielectric strength mean value as measured by a four-terminal method in which electrodes are contacted against the front and rear surfaces of the substrate can be made 20% or less, and furthermore 15% or less.

Figure 3:
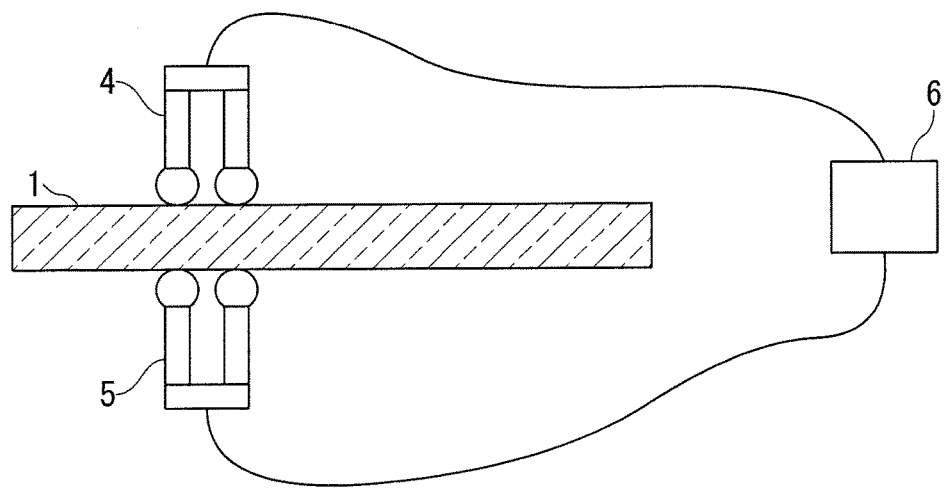
FIG. 3 is a cross-sectional view illustrating an example of a method for measuring a dielectric strength according to a four-terminal method with respect to a silicon nitride substrate.

FIG. 3 illustrates an example of a method for measuring the dielectric strength using the four-terminal method. In FIG. 3, reference numeral 1 denotes a silicon nitride substrate, reference numeral 4 denotes a front surface-side measurement terminal, reference numeral 5 denotes a rear surface-side measurement terminal, and reference numeral 6 denotes a measurement instrument. A tip of the front surface-side measurement terminals 4 and the rear surface-side measurement terminals 5 is a spherical shape. By making the tip of the measurement terminals a spherical shape, it is possible to make the contact pressure onto the silicon nitride substrate 1 a constant pressure, and measurement errors can thus be eliminated.

The front surface-side measurement terminals 4 and the rear surface-side measurement terminals 5 are disposed facing each other in a manner in which the silicon nitride substrate 1 is sandwiched therebetween. Regardless of which positions the front surface-side measurement terminals 4 and rear surface-side measurement terminals 5 are arranged at on the silicon nitride substrate 1, a variation from the dielectric strength mean value of the silicon nitride substrate 1 of the embodiment is 20% or less.

Figure 4:
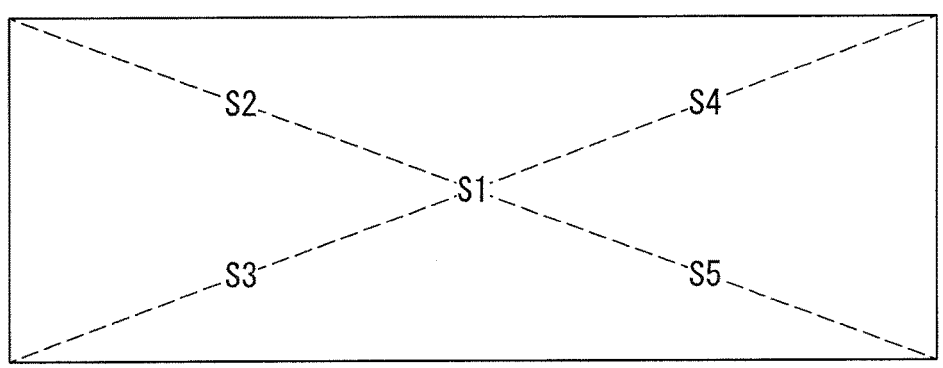
FIG. 4 is a plan view illustrating an example of locations for measuring the dielectric strength.

The aforementioned dielectric strength mean value is a mean value that is determined by measuring at least five locations on the silicon nitride substrate 1 by the aforementioned measurement method. One example of locations for measuring the dielectric strength is illustrated in FIG. 4. For example, in the case of measuring one substrate at five locations, the five locations S1, S2, S3, S4 and S5 that are shown in FIG. 4 are adopted as the measurement locations. That is, a point S1 that is a point of intersection (center) between diagonal lines of the substrate 1, and the four points S2 to S5 that are midpoints between S1 and the respective corner portions are adopted as the five locations.

The mean value of the dielectric strength at these five measurement points is adopted as the dielectric strength mean value of the silicon nitride substrate 1. That is, when the dielectric strength at S1 is taken as "ES1", the dielectric strength at S2 is taken as "ES2", the dielectric strength at S3 is taken as "ES3", the dielectric strength at S4 is taken as "ES4", and the dielectric strength at S5 is taken as "ES5", a dielectric strength mean value ESA is determined by the following equation. Further, at least five measurement points are used, and the number of measurement points may be six or more.

$$ESA=(ES1+ES2+ES3+ES4+ES5)/5$$

A variation (%) in the dielectric strength is determined as an absolute value of a proportion (%) of a deviation from the mean value by (|mean value ESA-ESn|/ESA)×100(%); where n=integer (measurement point number). Note that, with respect to measurement conditions other than those described above, measurement is performed in accordance with JIS-C-2141. Further, measurement of the dielectric strength is performed in Fluorinert. Fluorinert is a perfluorocarbon (PFC)-based insulating solvent.

Variations in the dielectric strength of the silicon nitride substrate of the embodiment are small amounts of 20% or less. The silicon nitride substrate is a silicon nitride sintered body made from silicon nitride crystal grains and a grain boundary phase. When used as a substrate, the silicon nitride substrate of the embodiment is used as a thin substrate in which the substrate thickness is 1.0 mm or less, and further, is 0.4 mm or less. This is because, the thermal resistance of the substrate is reduced and the heat dissipation is increased by thinning the substrate.

In a thin substrate in which the aforementioned substrate thickness T1 is 1.0 mm or less, if partial variations in the dielectric strength are large, the electric field is liable to concentrate at a portion at which the dielectric strength is low. Consequently, there is a concern that a portion at which the dielectric strength is low is liable to cause a dielectric breakdown. In the silicon nitride substrate of the embodiment, since variations in the dielectric strength are reduced, the electric field can be effectively prevented from concentrating at a portion at which the dielectric strength is low. Therefore, it is also possible to thin the substrate thickness T1 up to a thickness of 0.1 mm. In other words, the silicon nitride substrate of the embodiment is effective as a thin substrate in which the thickness T1 is ranging from 0.1 to 1.0 mm, and further, is from 0.1 to 0.4 mm.

Preferably, the dielectric strength mean value ESA is 15 kV/mm or more. If the mean value is less than 15 kV/mm, the insulating properties as a substrate will be insufficient. Preferably, the dielectric strength mean value ESA is 15 kV/mm or more, and more preferably is 20 kV/mm. If the above described ratio (T2/T1) is made 0.15 or less, it is easy for the dielectric strength mean value to be 20 kV/mm or more.

Preferably, a volume resistivity value when a voltage of 1,000 V is applied at room temperature (25° C.) is $60 \times 10^{12}$ Ωm or more. Further, preferably a ratio (ρv2/ρv1) between a volume resistivity value ρv1 when a voltage of 1,000 V is applied at room temperature (25° C.) and a volume resistivity value ρv2 when a voltage of 1,000 V is applied at 250° C. is 0.20 or more.

Figure 5:
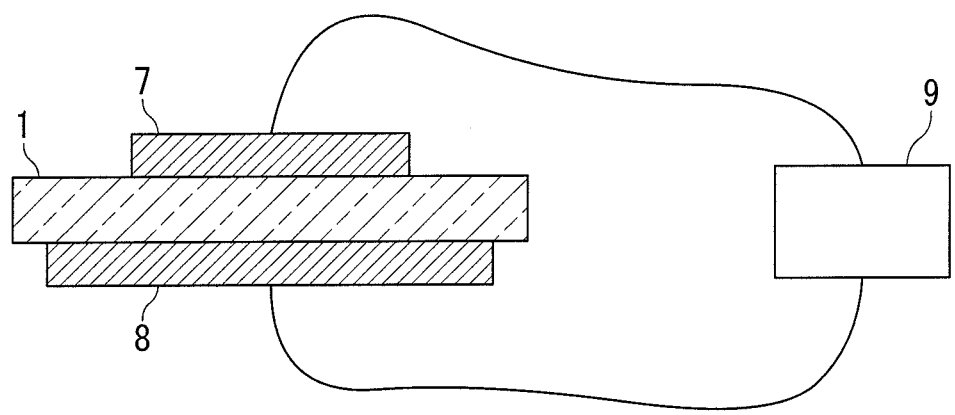
FIG. 5 is a side view illustrating one example of a method for measuring a volume resistivity value of a silicon nitride substrate.

FIG. 5 illustrates a method for measuring a volume resistivity value. In FIG. 5, reference numeral 1 denotes the silicon nitride substrate, reference numeral 7 denotes a front surface-side carbon electrode, reference numeral 8 denotes a rear surface-side carbon electrode, and reference numeral 9 denotes a measurement instrument. Note that, when measuring the volume resistivity value, the silicon nitride substrate 1 is pressed and immobilized by the front surface-side carbon electrode 7 and the rear surface-side carbon electrode 8. Further, the applied voltage is set as a direct current of 1000 V, and a volume resistance Rv after the voltage is applied for 60 seconds is measured. The volume resistivity value is determined by the equation: volume resistivity value ρv=Rvπd2/4t. Where, π represents the circular constant (=3.14), d represents the diameter of the front surface-side carbon electrode, and t represents the thickness of the silicon nitride substrate. A value obtained by measurement of the volume resistivity value in this manner at room temperature (25° C.) is taken as ρv1, and a value obtained by measurement in a 250° C. atmosphere is taken as ρv2. Further, with respect to measurement conditions other than those described above, measurement is performed in accordance with JIS-K-6911.

Preferably, the volume resistivity value when a voltage of 1,000 V is applied at room temperature (25° C.) is $60 \times 10^{12}$ Ωm or more. It is possible to mount various semiconductor elements on a silicon nitride circuit board in which a metallic circuit plate is provided on the silicon nitride substrate.

There are some semiconductor elements having a high operating voltage of 500 to 800 V. Preferably, ρv1 is $60 \times 10^{12}$ Ωm or more, and further preferably is $90 \times 10^{12}$ Ωm or more. By increasing the volume resistivity value upon decreasing variations in the dielectric strength as described above, excellent reliability can be obtained such that a dielectric breakdown does not occur even if a semiconductor element with a high operating voltage is mounted.

Further, by making the ratio ($\rho v2/\rho v1$) a high ratio of 0.20 or more, or furthermore, 0.40 or more, excellent insulating properties can be maintained even under a usage environment of a high temperature of 200 to 300° C. In recent years, semiconductor elements, such as SiC elements, are being developed for which the operating temperature is from 150 to 250° C. By using the silicon nitride substrate according to the embodiment as an insulating substrate that mounts such semiconductor elements, excellent reliability can also be obtained as a semiconductor device.

Further, when a cross section in the thickness direction of the silicon nitride substrate is observed with an enlarged photograph, preferably a maximum length of the grain boundary phase is 50 μm or less. Further, preferably the average long grain diameter of the silicon nitride crystal grains is 1.5 to 10 μm. In order to make the dielectric strength mean value a high value and make a variation therefrom a value that is 20% or less, it is effective to set the abundance ratio (T2/T1) between the silicon nitride crystal grains and the grain boundary phase in the thickness direction to a value within a predetermined range.

In addition, it is effective to control the size of the grain boundary phase for setting the volume resistivity value $\rho v1$ to a predetermined value or more and for setting the ratio ($\rho v2/\rho v1$) to a predetermined value or more. When a cross section in the thickness direction of the silicon nitride substrate is observed with an enlarged photograph, preferably the maximum length of a grain boundary phase is 50 μm or less, more preferably is 20 μm or less, and further preferably is 10 μm or less. The term "maximum length of the grain boundary phase in the thickness direction" refers to each of the aforementioned T2-1, T2-2, T2-3 and T2-4 being 50 μm or less.

Further, in order to set the maximum length of the grain boundary phase to be 50 μm or less, it is preferable that the average long grain diameter of the silicon nitride crystal grains is formed to be 1.5 to 10 μm. The long diameter of the silicon nitride crystal grains is determined by measuring the maximum diameter of respective silicon nitride crystal grains that are photographed within a unit area of 100 μm×100 μm in an enlarged photograph of an arbitrary sectional structure of the silicon nitride substrate, and adopting a mean value thereof as the long diameter of the silicon nitride crystal grains.

Measurement of the maximum diameter is performed by taking the longest diagonal line in silicon nitride crystal grains that appear in the enlarged photograph as the long diameter. This operation is performed in unit areas of 100 μm×100 μm at three different locations, and a mean value is taken as the average long grain diameter of the silicon nitride crystal grains.

If the aforementioned average long grain diameter of the silicon nitride crystal grains is a small diameter of less than 1.5 μm, grain boundaries between the silicon nitride crystal grains will increase, so that there is a risk that portions at which the ratio (T2/T1) exceeds 0.30 will be formed. If the average long grain diameter of the silicon nitride crystal grains is a large diameter that exceeds 10 μm, although the number of grain boundaries between the silicon nitride crystal grains will decrease, the lengths of the grain boundaries between the silicon nitride crystal grains will increase, so that there will be a risk that a portion at which the maximum length of the grain boundary phase cannot be made 50 μm or less will be formed. Therefore, the average long grain diameter of the silicon nitride crystal grains is preferably set to within a range of 1.5 to 10 μm, and more preferably set to within a range of 2 to 7 μm. Note that, an enlarged photograph that is magnified by 2,000 times or more is used. Further, in a case where it is difficult to determine crystal grains and a grain boundary, an enlarged photograph that is magnified by 5,000 times is used.

It is preferable that the porosity of the silicon nitride substrate is 3% or less. Further, the maximum diameter of the pores is 20 μm or less. In the silicon nitride substrate according to the embodiment, since the ratio (T2/T1) between the silicon nitride crystal grains and the grain boundary phase in the substrate thickness direction is controlled, even if the porosity is up to 3%, variations in the dielectric strength can be kept to 20% or less, and furthermore 15% or less.

Note that it is preferable to keep the amount of pores as low as possible, and the porosity is preferably set to 1% or less, and more preferably is 0.5% or less. Further, the maximum diameter of the pores is preferably set to 20 μm or less, more preferably 10 μm or less, and further preferably is 3 μm or less (including 0). The maximum diameter of the pores is determined based on an enlarged photograph at an arbitrary cross section.

Further, in order to set the volume resistivity value $\rho v1$ to be $60 \times 10^{12}$ Ωm or more and to set the ratio ($\rho v2/\rho v1$) to be 0.20 or more as described above, it is preferable that the porosity is 1% or less (including 0) and the maximum diameter of the pores is 10 μm or less (including 0) when an arbitrary surface or cross section of the silicon nitride substrate is observed with an enlarged photograph (magnified by 2,000 times or more).

The aforementioned enlarged photograph is an SEM photograph. In an SEM photograph, pores are distinguishable because a different contrast difference arises compared to the silicon nitride crystal grains and the grain boundary phase. By making the proportion and size of pores observed in an SEM photograph that is enlarged by magnifying by 2,000 times or, further, 5,000 times, small, an excellent volume resistivity value can be obtained even under a high temperature environment (under a 250° C. atmosphere).

Further, in a case where pores are present when an arbitrary cross section is observed with an enlarged photograph, preferably the grain boundary phase is present at 10% or more of the circumferential length of the pores. Air is present in portions in which there are pores. The silicon nitride grains are insulators. Further, a grain boundary phase component is formed by reaction of a sintering aid constituted by a metallic oxide. Therefore, because the grain boundary phase component is an oxide, the grain boundary phase component has insulating properties of a high level.

On the other hand, air is liable to become a passage for electricity. In particular, air is liable to become a passage for electricity when a large voltage of 600 V or more is applied to the substrate. Pores are residual defects from a densification process performed by a sintering step, and the densification progresses through the grain boundary phase.

Further, β-silicon nitride crystal grains have an elongated shape. The strength of the silicon nitride substrate is improved by randomly orienting the β-silicon nitride crystal grains in an intricately intertwined state. On the other hand, when the β-silicon nitride crystal grains are randomly oriented, gaps are liable to be formed at portions between the silicon nitride crystal grains. It becomes difficult for pores to be formed if the gaps formed between silicon nitride crystal grains are filled in with a grain boundary phase component.

Furthermore, even if pores are formed, it is difficult for structural defects to be included that are caused by densification inhibition at the periphery thereof. Therefore, it is preferable that the circumference of the pores is covered with a grain boundary phase component since it suggests a favorable densification process.

Consequently, preferably, after setting the maximum diameter of pores to 20 μm or less, a grain boundary phase component is caused to be present at 10% or more of the outer circumferential length of the pores. The larger that the proportion of the outer circumferential length of the pore at which a grain boundary phase component is present, the better that the structure is, and the proportion is preferably equal to or greater than 50% and less than or equal to 100%.

When the proportion of the outer circumferential length of the pores is increased to be a large proportion of 50% or more, the dielectric strength can be improved, and variations in the dielectric strength can be decreased. In other words, even if pores exist, the dielectric strength can be improved by covering the outer circumference of the pores with a grain boundary phase component.

Further, when a relative dielectric constant at 50 Hz is taken as $\varepsilon_{r50}$ and a relative dielectric constant at 1 kHz is taken as $\varepsilon_{r1000}$, it is preferable to satisfy a relation: $(\varepsilon_{r50}-\varepsilon_{r1000})/\varepsilon_{r50} \leq 0.1$. The term "relative dielectric constant" refers to a value obtained when the electric capacity of a capacitor when a medium is filled between electrodes is divided by the electric capacity thereof when there is a void (vacuum) between the electrodes. The medium in this case is the silicon nitride substrate. When the relation: $(\varepsilon_{r50}-\varepsilon_{r1000})/\varepsilon_{r50} \leq 0.1$ is established, it indicates that the relative dielectric constant of the silicon nitride substrate does not become large even if the frequency becomes high. This indicates that the structure is one in which it is difficult for polarization of the silicon nitride substrate to occur. Examples of a situation in which it is difficult for polarization to occur include one in which pores are small, or there are few pores. Furthermore, as described above, it is also effective to control the size of the grain boundary phase, and to cause a grain boundary phase component to be present at the circumference of pores. In addition, it is also effective to reduce a segregated region that is described later on.

Further, when an arbitrary cross section of the silicon nitride substrate is observed, it is preferable that a maximum length of the segregated region in the grain boundary phase is 5 μm or less (including 0). The grain boundary phase is a reaction phase that adopts a sintering aid as a main component. As described above, one or more kinds among the group consisting of rare earth elements, magnesium, titanium and hafnium are preferably selected as a sintering aid.

In this case, the term "segregated region" refers to a region in which a deviation of 30% or more arises with respect to the mean concentration of a specific element when a unit area of 20 μm×20 μm is color mapped by EPMA (electron probe microanalysis). The term "specific element" refers to a sintering aid component. For example, in a case where yttrium oxide ($Y_2O_3$) is used as a sintering aid component, mapping of the Y element is performed and a region in which the concentration deviates by 30% or more with respect to the mean concentration is measured and determined.

In a case where a plurality of sintering aid components is used, metallic elements of the respective components are subjected to the color-mapping. For example, in a case of using the three kinds of oxides $Y_2O_3$, MgO and $HfO_2$ as sintering aid components, a region in which the concentration deviates by 30% or more with respect to the mean concentration is determined for "Y", "MG" and "HF". Note that, the term "deviate by 30% or more with respect to the mean concentration" refers to both a case in which the relevant amount is greater than the mean concentration and a case in which the relevant amount is less than the mean concentration.

It is preferable that the aforementioned segregated region is small. The maximum length of the segregated region is preferably controlled to be 5 μm or less, and more preferably to 1 μm or less (including 0). By controlling the segregated region to be small, the volume resistivity value ρv1 can be set to 90×10$^{12}$ Ωm or more, and the aforementioned ratio (ρv2/ρv1) can be set to 0.40 or more.

Further, by realizing a state in which the maximum length of the segregated region is 5 μm or less, and more preferably is 1 μm or less (including 0), variations in the dielectric strength can be also reduced to be 5% or less. As the thickness of a substrate is reduced to be thin, the influence of the thickness will be greater. Therefore, in the case of a substrate whose thickness T1 is from 0.1 to 0.4 mm, it is preferable to form a state in which the length of a segregated region is 1 μm or less or a state in which a segregated region does not exist.

By adopting the above described configuration, even if the substrate thickness T1 of the silicon nitride substrate is thinned to be a thickness from 0.1 to 1.0 mm, or furthermore from 0.1 to 0.4 mm, variations in the dielectric strength can be reduced and the mean value of the dielectric strength can be increased.

Further, by controlling the maximum length of the grain boundary phase and the size of the silicon nitride crystal grains, not only the dielectric strength can be improved, but also the strength of the substrate can be made to be 600 MPa or more, after making the thermal conductivity of the silicon nitride substrate to be 50 W/m·K or more.

Further, by controlling the porosity, the pore size and the segregated region size (size of a segregated portion of a sintering aid), a further improvement in the dielectric strength and improvement in the volume resistivity value can be achieved.

In addition, by controlling a crystallized compound phase in a grain boundary phase to be 20% or more in terms of the area ratio as described in Patent Document 2, it becomes easy to set the thermal conductivity to 80 W/m·K or more, and furthermore, 90 W/m·K or more.

The silicon nitride substrate according to the embodiment is suitable for a silicon nitride circuit board. A circuit board is a component on which a metallic plate and a metal layer are provided as circuit portions. Examples of the metallic plate having good electrical conductivity may include: a copper plate; and an Al plate. Further, various kinds of bonding methods such as the active metal brazing method or direct bonding method can be applied for bonding of the metallic plate. Further, a metallic plate is also provided on the rear surface of the substrate as necessary. As examples of the metal layer, a metallized layer that is formed by heating a metallic paste, or a metallic thin film that is formed using a thin film formation technique such as an electroplating method, a sputtering method or a thermal spraying may be adopted.

Furthermore, the silicon nitride substrate of this embodiment may also be used as a substrate for a pressure-contact structure as described in Patent Document 1. In particular, the silicon nitride substrate according to the embodiment is also effective as a substrate for a pressure-contact structure, since the silicon nitride substrate is greatly improved in the dielectric strength thereof.

Next, a method for manufacturing the silicon nitride substrate according to the embodiment will be described hereunder. Although a method for manufacturing the silicon nitride substrate is not particularly limited as far as the silicon nitride substrate according to the embodiment has the above described structure, the following method is described as a method for efficiently manufacturing the silicon nitride substrate.

First, a silicon nitride powder and a sintering aid powder are prepared as raw material powder. It is preferable that, with respect to the silicon nitride powder, an α transformation rate is 80 mass % or more, an average grain diameter is 0.4 to 2.5 μm and an impurity oxygen content is 2 mass % or less. It is also preferable that the impurity oxygen content is 2 mass % or less, more preferably 1.0 mass % or less, and further preferably is 0.1 to 0.8 mass %. If the impurity oxygen content is a large content so as to exceed 2 mass %, there is a risk that a reaction will occur between the impurity oxygen and the sintering aid, and a grain boundary phase will be formed to a degree that is more than necessary.

Further, the sintering aid is preferably a metallic oxide powder having an average grain diameter of 0.5 to 3.0 μm. Oxides of rare earth elements such as magnesium, titanium and hafnium can be adopted as example of the metallic oxide powder. Adding a sintering aid as a metallic oxide facilitates the formation of a liquid phase component during the sintering step.

Further, as the sintering aid, one or more kinds of elements selected from the group consisting of rare earth elements, magnesium, titanium and hafnium is added in a total amount of 2 to 14 mass % in terms of oxide content. If the addition amount deviates from the aforementioned range, the grain growth of the silicon nitride crystal grains as well as the proportion of the grain boundary phase will deviate during the sintering step, and it will thus be difficult to make the ratio (T2/T1) fall within the target range.

Next, predetermined amounts of the silicon nitride powder and the sintering aid powder are mixed, and an organic binder is added to the mixture to prepare a raw material mixture. At this time, as necessary, amorphous carbon, a plasticizer or the like may also be added. The amorphous carbon functions as a deoxidizing agent. That is, the amorphous carbon reacts with oxygen and is discharged as $CO_2$ or CO to outside, so that promotion of a liquid phase reaction of the sintering step is facilitated.

Next, a molding step of molding the raw material mixture is performed. As a method for molding the raw material mixture, a general-purpose molding-die pressing method, a cold isostatic pressing (CIP) method or a sheet molding method such as the doctor-blade method or roll molding method can be applied. As necessary, a solvent such as toluene, ethanol or butanol may be blended with the raw material mixture.

After the above described molding step, a degreasing step is performed on thus formed compact. In the degreasing step, the compact is heated to a temperature of 500 to 800° C. for one to four hours in a non-oxidizing atmosphere so as to degrease a large portion of the organic binder added previously. A nitrogen gas atmosphere or an argon gas atmosphere may be adopted as examples of the non-oxidizing atmosphere.

Butyl methacrylate, polyvinyl butyral and polymethyl methacrylate may be adopted as example of the organic binder. When the total amount of the silicon nitride powder and the sintering aid powder is taken as 100 parts by mass, preferably the added amount of the organic binder is 3 to 17 parts by mass.

If the addition amount of the organic binder is less than 3 parts by mass, the binder amount will be too small and it will be difficult to maintain the shape of the compacts. In such a case, it will be difficult to improve mass productivity by stacking the compacts in multiple layers (tiers). On the other hand, if the binder amount is a large amount so as to exceed 17 parts by mass, there will be formed large cavities in the respective compacts after the degreasing step (compacts after the degreasing treatment), so that the pores of the silicon nitride substrate will be large.

Next, the compact that was subjected to the degreasing treatment is accommodated in a firing container and subjected to a heat treatment step in which the degreased compact is heated to a temperature of 1400 to 1650° C. in a non-oxidizing atmosphere inside a calcining (sintering) furnace, and retained in the heated state for one to eight hours. A liquid phase reaction of the sintering aid powder is promoted by this treatment. By promoting the liquid phase reaction, diffusion of a liquid phase component to the grain boundary of the silicon nitride crystal grains is promoted and pores are decreased.

If the retention temperature is less than 1400° C., it will be difficult for a liquid phase reaction to occur, while if the retention temperature exceeds 1650° C., because grain growth of the silicon nitride crystal grains proceeds, an effect of decreasing pores by diffusion of a liquid phase component is not adequately obtained. Nitrogen gas ($N_2$) or argon gas (Ar) may be adopted as examples of the non-oxidizing atmosphere. It is also effective to stack the compacts in multiple layers to improve mass productivity. Further, by stacking the respective compacts in multiple layers, the temperature inside the sintering furnace becomes uniform, so that the liquid phase reaction can thus be made uniform.

Next, a sintering step is performed. The sintering step is performed by heating the compact at a temperature of 1800 to 1950° C. in a non-oxidizing atmosphere for 8 to 18 hours. A nitrogen gas atmosphere or a reducing atmosphere including nitrogen gas is preferable as the non-oxidizing atmosphere. Further, preferably the pressure inside the sintering furnace is a pressurized atmosphere.

If the compact is fired in a low temperature state in which the sintering temperature is less than 1800° C., the grain growth of the silicon nitride crystal grains will be insufficient and it will be difficult to obtain a dense sintered body. On the other hand, if the compact is fired at a sintering temperature that is higher than 1950° C., there is a risk that the compact will decompose into Si and $N_2$ in a case where the atmospheric pressure inside the furnace is low, so that it is preferable to control the sintering temperature to within the aforementioned range.

In a case where compacts are arranged in multiple layers (tiers) as described above, the sintering temperature is preferably set to less than or equal to 1950° C. since there is a risk that pressure variations will arise inside the sintering furnace. Further, if the sintering temperature is higher than 1950° C., there is a risk that the silicon nitride crystal grains will grow more than required, and the target ratio of (T2/T1) will not be obtained.

Further, it is preferable that a cooling rate of the sintered body after the sintering step is set to 100° C./h or less. By slowly (moderately) cooling the sintered body at a cooling rate of 100° C./h or less, or furthermore, 50° C./h or less, the grain boundary phase can be crystallized. The proportion of a crystallized compound in the grain boundary phase can be increased. A liquid phase reaction of the grain boundary phase is promoted by the aforementioned heat treatment step.

Therefore, when crystallization of the grain boundary phase is performed, the amount of aggregation and segregation of a liquid phase that is generated in the sintered body is small, so that a grain boundary phase is obtained in which refined crystalline structures are uniformly dispersed. Further, pores that are formed in the crystalline structures can also be made minute and simultaneously reduced.

Furthermore, by setting the cooling rate after the sintering step to 100° C./h or less, the proportion of a crystallized compound phase in the grain boundary phase can be made 20% or more in terms of the area ratio, and furthermore, can be made 50% or more. Due to crystallization of the grain boundary phase, the thermal conductivity of the silicon nitride substrate can be increased to be 80 W/m·K or more.

Note that, if furnace cooling (natural cooling when the switch of the furnace is turned off) is adopted with respect to the cooling rate after the sintering step, normally the cooling rate will be around 600° C./h. In such a case also, if the aforementioned heat treatment step is performed, because uniformity of the grain boundary phase is achieved, upon making the thermal conductivity 50 W/m·K or more, the aforementioned ratio (T2/T1) and variations in the dielectric strength can be kept within the predetermined ranges.

Further, after the sintering step, it is also effective to perform an additional heat treatment. It is desirable to perform the additional heat treatment at a temperature that is equal to or higher than a liquid phase generating temperature and is lower than the treatment temperature in the sintering step. It is also desirable to perform the additional heat treatment under a pressurization condition. In the sintering step, a liquid phase component that is cooled from a surface activity state, namely, grain growth, enters a stationary state in the grain boundary and is immobilized. However, stabilization from an active region is liable to proceed in a nonuniform manner. Hence, by performing heat treatment until a state in which a liquid phase is once more generated and flows, while on the other hand until a state in which grain growth does not proceed, it becomes possible to more homogeneously improve stabilization of a grain boundary by the cooling thereafter.

Further, when performing an additional heat treatment, it is effective to press the sintered body and to flip over the rear and front surfaces of the sintered body and the like. By performing the additional heat treatment, pores in the silicon nitride substrate can be eliminated, the pores can be made smaller, and a state can be entered in which a grain boundary phase component is present along the circumferential length of pores. Preferably, the temperature for the aforementioned heat treatment is from 1000° C. or more to 1700° C. or less.

By performing the heat treatment at a temperature in the aforementioned range from 1000° C. to 1700° C., the grain growth of the silicon nitride crystal grains can be suppressed, and a grain boundary phase component can be moved somewhat. At such time, by performing pressing and flipping over the rear and front surfaces, obtainment of effects such that pores are eliminated, pores are reduced, and a state is entered in which a grain boundary phase component is present along the circumferential length of pores is easily obtained.

If the manufacturing method described in the foregoing is used, the silicon nitride substrate according to the embodiment can be easily obtained.

EXAMPLES

Examples 1 to 20 and Comparative Example 1

As a silicon nitride powder, a powder was prepared in which the average grain diameter was 1.0 µm, an impurity oxygen content was 1 mass %, and an α transformation rate was 98%. Further, the substances shown in Table 1 and Table 2 were prepared as sintering aid powder. Note that, the sintering aid powder that was prepared had an average grain diameter of 0.8 to 1.6 µm.

The silicon nitride powder and sintering aid powder were mixed to prepare a raw material mixture. A dispersing agent and an organic solvent were blended into the raw material mixture, and ball-mill mixing was performed. Next, 10 parts by mass of butyl methacrylate as an organic binder and four parts by mass of dibutyl phthalate as a plasticizer were added to 100 parts by mass of the raw material powder mixture, the mixture was mixed, an organic solvent was additionally added, and then ball-mill mixing was sufficiently performed to prepare a slurry-like raw material mixture. The slurry viscosity was adjusted to 5000 to 15000 CPS, and thereafter the raw material mixture was molded into sheets by a sheet molding method (doctor-blade method) and dried to thereby prepare compacts (green sheets).

The compacts were heated for 1 to 4 hours at a temperature of 500 to 800° C. in a nitrogen gas atmosphere and then subjected to a degreasing step.

Next, the heat treatment steps and sintering steps shown in Table 1 and Table 2 were performed on the compacts that had undergone the degreasing treatment. After performing these steps, silicon nitride substrates of the examples and comparative example were prepared under the conditions shown in Table 1 and Table 2. Further, the heat treatment step and sintering step were executed in a state in which the compacts were stacked in multiple layers (stacks of 10 tiers).

TABLE 1

| Sample No. | Composition | | Substrate Size Length × Width × Thickness (mm) | Sintering Condition Upper Column: Heat Treatment Process Lower Column: Sintering Process |
|---|---|---|---|---|
| | Silicon Nitride (mass %) | Sintering Aid (mass %) | | |
| Example 1 | (95) | $Y_2O_3$ (3) MgO (2) | 50 × 50 × 0.635 | • 1500° C. × 2 hr in Nitrogen Gas Atmosphere • 1900° C. × 9 hr in Nitrogen Gas Atmosphere →Furnace Cooling (600° C./hr) |
| Example 2 | (91) | $Y_2O_3$ (3) $Er_2O_3$ (4) $HfO_2$ (1) MgO (1) | 50 × 50 × 0.635 | • 1550° C. × 5 hr in Nitrogen Gas Atmosphere • 1850° C. × 10 hr in Nitrogen Gas Atmosphere →Cooling Rate 50° C./hr |
| Example 3 | (89) | $Y_2O_3$ (7) $HfO_2$ (2) | 50 × 30 × 0.32 | • 1430° C. × 8 hr in Nitrogen Gas Atmosphere • 1800° C. × 12 hr in Nitrogen Gas Atmosphere |

TABLE 1-continued

| Sample No. | Composition Silicon Nitride (mass %) | Sintering Aid (mass %) | Substrate Size Length × Width × Thickness (mm) | Sintering Condition Upper Column: Heat Treatment Process Lower Column: Sintering Process |
|---|---|---|---|---|
| Example 4 | (93) | MgO (1)<br>TiO$_2$ (1)<br>Y$_2$O$_3$ (3)<br>MgO (4) | 50 × 40 × 0.32 | • 1600° C. × 6 hr in Nitrogen Gas Atmosphere<br>• 1950° C. × 8 hr in Nitrogen Gas Atmosphere<br>→Furnace Cooling (600° C./hr) |
| Example 5 | (87) | Y$_2$O$_3$ (4)<br>Er$_2$O$_3$ (5)<br>HfO$_2$ (2)<br>TiO$_2$ (1)<br>MgO (1) | 60 × 40 × 0.20 | • 1650° C. × 2 hr in Nitrogen Gas Atmosphere<br>• 1870° C. × 15 hr in Nitrogen Gas Atmosphere<br>→Cooling Rate 20° C./hr |
| Example 6 | (93) | Y$_2$O$_3$ (3)<br>MgO (3)<br>HfO$_2$ (1) | 60 × 40 × 0.20 | • 1500° C. × 5 hr in Nitrogen Gas Atmosphere<br>• 1900° C. × 11 hr in Nitrogen Gas Atmosphere<br>→Cooling Rate 100° C./hr |

→Cooling Rate 100° C./hr

TABLE 2

| Sample No. | Composition Silicon Nitride (mass %) | Sintering Aid (mass %) | Substrate Size Length × Width × Thickness (mm) | Sintering Conditions Upper Column: Heat Treatment Process Lower Column: Sintering Process |
|---|---|---|---|---|
| Example 7 | (88) | Y$_2$O$_3$ (3)<br>Er$_2$O$_3$ (5)<br>HfO$_2$ (1)<br>TiO$_2$ (2)<br>MgO (1) | 50 × 50 × 0.15 | • 1560° C. × 5 hr in Nitrogen Gas Atmosphere<br>• 1830° C. × 10 hr in Nitrogen Gas Atmosphere<br>→Cooling Rate 40° C./hr |
| Example 8 | (87) | Y$_2$O$_3$ (8)<br>HfO$_2$ (2)<br>TiO$_2$ (2)<br>MgO (1) | 50 × 30 × 0.25 | • 1400° C. × 4 hr in Nitrogen Gas Atmosphere<br>• 1880° C. × 13 hr in Nitrogen Gas Atmosphere<br>→Cooling Rate 80° C./hr |
| Example 9 | (88.9) | Y$_2$O$_3$ (4)<br>Er$_2$O$_3$ (4)<br>HfO$_2$ (2)<br>TiO$_2$ (0.1)<br>MgO (1) | 40 × 40 × 0.20 | • 1520° C. × 2 hr in Nitrogen Gas Atmosphere<br>• 1870° C. × 18 hr in Nitrogen Gas Atmosphere<br>→Cooling Rate 80° C./hr |
| Example 10 | (87.5) | Y$_2$O$_3$ (4)<br>Er$_2$O$_3$ (5)<br>HfO$_2$ (2)<br>TiO$_2$ (0.5)<br>MgO (1) | 70 × 50 × 0.25 | • 1610° C. × 7 hr in Nitrogen Gas Atmosphere<br>• 1930° C. × 16 hr in Nitrogen Gas Atmosphere<br>→Cooling Rate 20° C./hr |
| Comparative Example 1 | (92) | Y$_2$O$_3$ (3)<br>MgO (5) | 50 × 50 × 0.635 | • Heat Treatment Process (None)<br>• 1850° C. × 10 hr in Nitrogen Gas Atmosphere<br>→Cooling Rate 100° C./hr |

With respect to the silicon nitride substrates according to each example and the comparative example, the thermal conductivity, three-point bending strength and sectional structure in the substrate thickness direction were observed, and the ratio (T2/T1), maximum diameter of the grain boundary phase in the thickness direction, average grain diameter with respect to the long diameter of the silicon nitride crystal grains, and the porosity were examined. The pore size and a segregated region in the grain boundary phase were also examined.

Note that, the aforementioned thermal conductivity was determined by a laser flash method. The three-point bending strength was measured in accordance with JIS-R-1601 (2008). The substrate thickness T1 was measured with a calipers. The porosity was determined by the mercury penetration method. Further, an SEM photograph (magnification of 2,000 times) of an arbitrary sectional structure was photographed in the substrate thickness direction, and the maximum diameter of a grain boundary phase in the thickness direction as well as the average grain diameter with respect to the long diameter of the silicon nitride crystal grains were examined.

Further, an enlarged photograph (SEM photograph with a magnification of 5000 times) of a unit area of 20 μm×20 μm at an arbitrary cross section in the substrate thickness direction was photographed at 10 locations, and pore sizes (maximum diameter) were determined. Further, unit areas of 20 μm×20 μm were subjected to color mapping with regard to metallic elements of sintering aid components by EPMA. The unit areas of 20 μm×20 μm were measured at five locations, and the mean concentration and also the size of segregated regions (regions at which the concentration of the metallic element deviated by 30% or more) were determined. The results are shown in Table 3 and Table 4 below.

TABLE 3

| Sample No. | Thermal Conductivity (W/m·K) | Three Point Bending Strength (MPa) | Porocity (%) | Ratio (T2/T1) | SEM Photograph (2000 Magnifications) Maximum Length of Grain Boundary Phase in Thickness Direction (μm) | Average Long Grain Diameter of Silicon Nitride Crystal Grains (μm) |
| --- | --- | --- | --- | --- | --- | --- |
| Example 1 | 90 | 600 | 1.0 | 0.08 | 14 | 10 |
| Example 2 | 85 | 700 | 0.3 | 0.25 | 10 | 5 |
| Example 3 | 80 | 650 | 0.0 | 0.20 | 4 | 3 |
| Example 4 | 85 | 660 | 0.5 | 0.10 | 7 | 7 |
| Example 5 | 95 | 680 | 0.0 | 0.17 | 3 | 4 |
| Example 6 | 90 | 720 | 0.3 | 0.13 | 5 | 5 |
| Example 7 | 98 | 750 | 0.0 | 0.19 | 3 | 3 |
| Example 8 | 92 | 700 | 0.2 | 0.17 | 6 | 6 |
| Example 9 | 90 | 730 | 0.2 | 0.20 | 4 | 5 |
| Example 10 | 95 | 700 | 0.0 | 0.22 | 4 | 5 |
| Comparative Example 1 | 80 | 600 | 1.0 | 0.42 | 54 | 14 |

TABLE 4

| Sample No. | SEM Photograph (5000 Magnifications) Pore Size (Maximum Diameter) (μm) | EPMA Color Mapping Maximum Length of Segregated Region in Grain Boundary Phase (μm) |
| --- | --- | --- |
| Example 1 | 3.0 | 2.0 |
| Example 2 | 1.0 | 1.5 |
| Example 3 | 0.2 | None |
| Example 4 | 0.5 | 1.0 |
| Example 5 | 0.2 | None |
| Example 6 | 0.2 | 0.5 |
| Example 7 | 0.2 | None |
| Example 8 | 0.4 | 0.8 |
| Example 9 | 0.2 | 0.6 |
| Example 10 | 0.2 | None |
| Comparative Example 1 | 24 | 4 |

Examples 11 to 20

Next, the additional heat treatments shown in Table 5 were performed on the silicon nitride substrates of Examples 1 to 10.

TABLE 5

| Sample No. | Silicon Nitride Substrate | Additional Heat Treatment |
| --- | --- | --- |
| Example 11 | Example 1 | Pressing, 1600° C. × 1 hr |
| Example 12 | Example 2 | Pressing, 1000° C. × 2 hr |
| Example 13 | Example 3 | Flipping over, 1100° C. × 5 hr |
| Example 14 | Example 4 | Flipping over, 1000° C. × 3 hr |
| Example 15 | Example 5 | Pressing, 1050° C. × 3 hr |
| Example 16 | Example 6 | Pressing, 1300° C. × 2 hr |
| Example 17 | Example 7 | Flipping over, 1400° C. × 3 hr |
| Example 18 | Example 8 | Flipping over, 1350° C. × 2 hr |
| Example 19 | Example 9 | Pressing, 1000° C. × 5 hr |
| Example 20 | Example 10 | Pressing, 1100° C. × 2 hr |

The pore size (maximum diameter) and the proportion at which a grain boundary phase component was present at the circumferential length of a pore were determined for the silicon nitride substrates of Examples 1 to 20 and Comparative Example 1. The pore size (maximum diameter) was determined using an SEM photograph (magnification of 5,000 times). The proportion at which a grain boundary phase component was present at the circumferential length of a pore was determined by EPMA. The results are shown in Table 6 below.

TABLE 6

| Sample No. | Pore Size (Maximum Diameter) (μm) | Proportion at which Grain Boundary Phase Component is present at Circumferential Length of Pore (%) |
| --- | --- | --- |
| Example 1 | 3.0 | 47 |
| Example 2 | 1.0 | 77 |
| Example 3 | 0.2 | 73 |
| Example 4 | 0.5 | 55 |
| Example 5 | 0.2 | 79 |
| Example 6 | 0.2 | 63 |
| Example 7 | 0.2 | 82 |
| Example 8 | 0.4 | 85 |
| Example 9 | 0.2 | 87 |
| Example 10 | 0.2 | 84 |
| Example 11 | 1.9 | 66 |
| Example 12 | 0.2 | 98 |
| Example 13 | None | — |
| Example 14 | 0.1 | 75 |
| Example 15 | None | — |
| Example 16 | None | — |
| Example 17 | None | — |
| Example 18 | 0.1 | 100 |
| Example 19 | None | — |
| Example 20 | None | — |

As is apparent from the results shown in the above Table 6, in the silicon nitride substrates according to the respective examples, the pores were small and a grain boundary phase component was present at 10% or more of the circumferential length of the pores. Further, by performing the additional heat treatment, the pores could be made smaller (including cases where no pores existed).

The dielectric strength and volume resistivity value were measured for the silicon nitride substrates according to the above described examples and comparative example. The aforementioned dielectric strength was measured by the four-terminal method in accordance with JIS-C-2141. Spherical electrodes that each had a tip with a diameter of 20 mm were used as the measuring terminals. Further, the measurement of the dielectric strength was performed in Fluorinert. The mean value and variation were determined at the five measurement locations shown in FIG. 4 (S1 to S5).

The volume resistivity value was measured in accordance with JIS-K-6911. A front surface-side carbon electrode was disk-shaped with a diameter of 20 mm, and a rear surface-side carbon electrode was disk-shaped with a diameter of 28 mm. The applied voltage was 1000 V. A volume resistivity value ρv1 at room temperature (25° C.), and a volume resistivity value ρv2 at 250° C. were measured.

The frequency dependency of the relative dielectric constant was also investigated. The frequency dependency of the relative dielectric constant was determined by $(\varepsilon_{r50} - \varepsilon_{r1000})/\varepsilon_{r50}$ when taking the relative dielectric constant at 50 Hz as $\varepsilon_{r50}$, and taking the relative dielectric constant at 1 kHz as $\varepsilon_{r1000}$. The results are shown in Table 7 and Table 8.

TABLE 7

| Sample No. | Dielectric Strength | | ρ v 1 Room Temp. (25° C.) | Volume Resistivity Value (×10$^{12}$ Ωm) | | Frequency Dependency of Relative Dielectric Constant $(\varepsilon_{r50} - \varepsilon_{r1000})/\varepsilon_{r50}$ |
|---|---|---|---|---|---|---|
| | Mean Value (kV/mm) | Variation (%) | | ρ v 2 (250° C.) | ρ v 2/ρ v 1 | |
| Example 1 | 17 | 14 | 100 | 22 | 0.22 | 0.10 |
| Example 2 | 22 | 10 | 150 | 45 | 0.30 | 0.07 |
| Example 3 | 23 | 5 | 200 | 90 | 0.45 | 0.04 |
| Example 4 | 20 | 8 | 170 | 54 | 0.32 | 0.05 |
| Example 5 | 24 | 5 | 210 | 107 | 0.50 | 0.03 |
| Example 6 | 20 | 7 | 180 | 63 | 0.35 | 0.02 |
| Example 7 | 23 | 4 | 220 | 117 | 0.53 | 0.01 |
| Example 8 | 20 | 6 | 200 | 80 | 0.40 | 0.05 |
| Example 9 | 21 | 6 | 190 | 80 | 0.42 | 0.04 |
| Example 10 | 24 | 4 | 190 | 93 | 0.49 | 0.03 |
| Comparative Example 1 | 15 | 22 | 55 | 9 | 0.17 | 0.24 |

TABLE 8

| Sample No. | Dielectric Strength | | ρ v 1 Room Temp. (25° C.) | Volume Resistivity Value (×10$^{12}$ Ωm) | | Frequency Dependency of Relative Dielectric Constant $(\varepsilon_{r50} - \varepsilon_{r1000})/\varepsilon_{r50}$ |
|---|---|---|---|---|---|---|
| | Mean Value (kV/mm) | Variation (%) | | ρ v 2 250° C. | ρ v 2/ρ v 1 | |
| Example 11 | 20 | 10 | 130 | 40 | 0.31 | 0.08 |
| Example 12 | 25 | 7 | 185 | 93 | 0.50 | 0.03 |
| Example 13 | 26 | 2 | 240 | 156 | 0.65 | 0.02 |
| Example 14 | 27 | 5 | 180 | 77 | 0.43 | 0.02 |
| Example 15 | 28 | 2 | 250 | 173 | 0.69 | 0.01 |
| Example 16 | 25 | 4 | 200 | 104 | 0.52 | 0.008 |
| Example 17 | 27 | 2 | 260 | 182 | 0.70 | 0.005 |
| Example 18 | 28 | 3 | 255 | 153 | 0.60 | 0.02 |
| Example 19 | 27 | 3 | 230 | 129 | 0.56 | 0.01 |
| Example 20 | 29 | 2 | 250 | 158 | 0.63 | 0.01 |

As described above, the silicon nitride substrates according to the respective examples exhibited excellent characteristics with respect to dielectric strength and volume resistivity values. The silicon nitride substrates also exhibited excellent characteristics in relation to frequency dependency of the relative dielectric constant.

Such a silicon nitride substrate has excellent insulating properties even if the silicon nitride substrate is thinned. Therefore, the silicon nitride substrate can ensure excellent reliability even when applied to a silicon nitride circuit board or a substrate for a pressure-contact structure.

Although several embodiments of the present invention have been illustrated above, these embodiments have been presented by way of example only, and are not intended to limit the scope of the invention. Indeed, these novel embodiments may be embodied in a variety of other forms; furthermore, various omissions, substitutions and changes in the form of the embodiments described herein may be made without departing from the gist of the invention. These embodiments and the modifications thereof are included within the scope and gist of the invention, and are also included in the scope of the inventions described in the accompanying claims and their equivalents. Further, the respective embodiments described above may be embodied by combining the embodiments with each other.

REFERENCE SIGNS LIST

1 Silicon nitride substrate
2 Silicon nitride crystal grain
3 Grain boundary phase
4, 5 Measuring terminals used in four-terminal method
6 Dielectric strength measurement instrument
7, 8 Carbon electrode
9 Volume resistivity value measurement instrument

The invention claimed is:

1. A silicon nitride substrate containing at least one element selected from rare earth element, magnesium, titanium and hafnium as a sintering aid in a total amount of 2 to 14 mass % in terms of oxide content, and comprising silicon nitride crystal grains and a grain boundary phase and having a thermal conductivity of 50 W/m·K or more, wherein, in a sectional structure of the silicon nitride substrate, a ratio, T2/T1, of a total length T2 of the grain boundary phase in a thickness direction with respect to a thickness T1 of the silicon nitride substrate is 0.01 to 0.30, an average grain diameter with respect to a long diameter of the silicon nitride crystal grains is between 1.5 and 10 μm, and a variation from a dielectric strength mean value when measured by a four-terminal method in which electrodes are brought into contact with front and rear surfaces of the substrate is 20% or less, and wherein a ratio (ρv2/ρv1) between a volume resistivity value ρv1 when a voltage of 1000 V is applied at room temperature (25° C.) and a volume resistivity value ρv2 when a voltage of 1000 V is applied at 250° C. is 0.20 or more.

2. The silicon nitride substrate according to claim 1, wherein a variation in the dielectric strength is 15% or less.

3. The silicon nitride substrate according to claim 1, wherein the dielectric strength mean value is 15 kV/mm or more.

4. The silicon nitride substrate according to claim 1, wherein a volume resistivity value when a voltage of 1000 V is applied at 25° C. is $60 \times 10^{12}$ Ωm or more.

5. The silicon nitride substrate according to claim 1, wherein, when a relative dielectric constant at 50 Hz is represented by $\varepsilon_{r50}$ and a relative dielectric constant at 1 kHz is represented by $\varepsilon_{r1000}$, $(\varepsilon_{r50}-\varepsilon_{r1000})/\varepsilon_{r50} \leq 0.1$.

6. The silicon nitride substrate according to claim 1, wherein, when a cross section in a thickness direction of the silicon nitride substrate is observed with an enlarged photograph, a maximum length of the grain boundary phase is 50 μm or less.

7. The silicon nitride substrate according to claim 1, wherein a porosity of the silicon nitride substrate is 3% or less.

8. The silicon nitride substrate according to claim 1, wherein, when an arbitrary surface or cross section of the silicon nitride substrate is observed with an enlarged photograph, a maximum diameter of a pore is 0 μm or more and no more than 20 μm.

9. The silicon nitride substrate according to claim 1, wherein the substrate has pores, and when an arbitrary cross section of the silicon nitride substrate is observed with an enlarged photograph, a maximum diameter of a pore is greater than 0 μm and no more than 20 μm, and a grain boundary phase component is present at 10% or more of a circumferential length of a pore.

10. The silicon nitride substrate according to claim 1, wherein, when an arbitrary cross section of the silicon nitride substrate is observed, a maximum length of a segregated region in the grain boundary phase is 0 μm or more and no more than 5 μm.

11. The silicon nitride substrate according to claim 1, wherein the thickness T1 of the silicon nitride substrate is from 0.1 to 1.0 mm.

12. The silicon nitride substrate according to claim 1, wherein, in terms of an area ratio, 20% or more of the grain boundary phase is a crystallized compound phase.

13. A silicon nitride circuit board in which a circuit portion is provided on a silicon nitride substrate according to claim 1.

14. The silicon nitride substrate according to claim 1, wherein a maximum diameter of a pore is 3 μm or less.

15. The silicon nitride substrate according to claim 1, wherein the thickness T1 of the silicon nitride substrate is from 0.15 to 0.25 mm.

16. The silicon nitride substrate according to claim 1, wherein the silicon nitride substrate is used as a substrate for a pressure-contact structure.

* * * * *